(12) United States Patent
Dovrat et al.

(10) Patent No.: US 9,381,759 B2
(45) Date of Patent: Jul. 5, 2016

(54) METHOD AND SYSTEM FOR APPLYING MATERIALS ON A SUBSTRATE

(75) Inventors: Michael Dovrat, Modi'in (IL); Ran Asher Peleg, Kefar-Saba (IL); Amir Hadar, Kfar Saba (IL); Hanan Gothait, Rehovot (IL)

(73) Assignee: XJET LTD, Rehovot (IL)

(*) Notice: Subject to any disclaimer, the term of this patent is extended or adjusted under 35 U.S.C. 154(b) by 627 days.

(21) Appl. No.: 13/131,392

(22) PCT Filed: Nov. 30, 2009

(86) PCT No.: PCT/IL2009/001125
§ 371 (c)(1),
(2), (4) Date: Aug. 4, 2011

(87) PCT Pub. No.: WO2010/061394
PCT Pub. Date: Jun. 3, 2010

(65) Prior Publication Data
US 2011/0279544 A1    Nov. 17, 2011

Related U.S. Application Data

(60) Provisional application No. 61/118,653, filed on Nov. 30, 2008.

(51) Int. Cl.
*B41J 25/00* (2006.01)
*B41J 3/54* (2006.01)
*H05K 3/12* (2006.01)

(52) U.S. Cl.
CPC ............... *B41J 25/001* (2013.01); *B41J 3/543* (2013.01); *H05K 3/125* (2013.01); *H05K 2201/09236* (2013.01)

(58) Field of Classification Search
CPC .......... B41J 2/2135; B41J 25/34; B41J 2/145; B41J 25/001; B41J 25/005; B41J 2/155; B41J 25/308

USPC ................... 347/9–12, 14, 15, 16, 20, 40–43, 347/100–105
See application file for complete search history.

(56) References Cited

U.S. PATENT DOCUMENTS

| 3,451,791 A | 6/1969 | Meadoes |
| 5,136,515 A | 8/1992 | Helinski |

(Continued)

FOREIGN PATENT DOCUMENTS

| DE | 4324647 | 1/1994 |
| EP | 1 918 026 | 5/2008 |

(Continued)

OTHER PUBLICATIONS

International Search Report for International Application No. PCT/IL2009/001125 date of mailing Mar. 18, 2010.

(Continued)

*Primary Examiner* — Thinh Nguyen
(74) *Attorney, Agent, or Firm* — Finnegan, Henderson, Farabow, Garrett & Dunner, LLP

(57) ABSTRACT

Embodiments of the invention are directed to a method of printing lines. A method may include positioning a plurality of print units according to a predefined spacing parameter. A method may include depositing material on a substrate by a plurality of print units to form a respective plurality of parallel lines according to a predefined spacing parameter. A printing unit may be positioned at an angle with respect to a predefined scan direction such that a predefined width of a printed line is achieved. A substrate may be rotated between scans such that a plurality of lines in a respective plurality of directions is printed in a scan direction.

20 Claims, 7 Drawing Sheets

(56) References Cited

U.S. PATENT DOCUMENTS

| | | | |
|---|---|---|---|
| 5,151,377 A | 9/1992 | Hanoka et al. | |
| 5,640,183 A * | 6/1997 | Hackleman | 347/40 |
| 6,291,123 B1 | 9/2001 | Ohno et al. | |
| 6,305,769 B1 | 10/2001 | Thayer et al. | |
| 6,328,418 B1 * | 12/2001 | Yamada | B41J 2/15 347/12 |
| 6,471,352 B2 * | 10/2002 | Akahira | 347/106 |
| 6,536,863 B1 | 3/2003 | Beauchamp et al. | |
| 7,252,365 B2 * | 8/2007 | Yakubov et al. | 347/41 |
| 7,393,073 B2 * | 7/2008 | Zach | 347/12 |
| 7,502,023 B2 | 3/2009 | Zinniel et al. | |
| 7,506,960 B2 * | 3/2009 | Chikanawa | B41J 2/1433 347/42 |
| 7,513,595 B2 * | 4/2009 | Nakamura | 347/40 |
| 7,919,538 B2 | 4/2011 | Vo et al. | |
| 9,004,667 B2 | 4/2015 | Taguchi | |
| 2004/0115339 A1 | 6/2004 | Ito | |
| 2004/0246294 A1 | 12/2004 | Mitsuzawa | |
| 2005/0104241 A1 | 5/2005 | Kritchman et al. | |
| 2005/0253879 A1 * | 11/2005 | Yamanobe | B41J 2/2132 347/5 |
| 2006/0132571 A1 | 6/2006 | Baker | |
| 2007/0063366 A1 | 3/2007 | Cunningham et al. | |
| 2007/0064029 A1 | 3/2007 | Edwards et al. | |
| 2007/0107773 A1 | 5/2007 | Fork et al. | |
| 2007/0153035 A1 | 7/2007 | Jung et al. | |
| 2008/0036799 A1 | 2/2008 | Ittel | |
| 2009/0244153 A1 | 10/2009 | Miyamoto | |
| 2009/0321123 A1 | 12/2009 | Lochtman | |
| 2010/0040767 A1 | 2/2010 | Uibel et al. | |
| 2011/0151665 A1 | 6/2011 | Gothati et al. | |
| 2012/0308837 A1 | 12/2012 | Schlechtriemen et al. | |

FOREIGN PATENT DOCUMENTS

| | | |
|---|---|---|
| JP | 1994-029559 | 2/1994 |
| WO | WO 2007/076424 | 7/2007 |
| WO | WO 2008/084972 | 7/2008 |
| WO | WO 2009/017648 | 2/2009 |
| WO | WO 2009/029939 | 3/2009 |
| WO | WO 2009/141448 | 11/2009 |
| WO | WO 2014/068579 | 5/2014 |

OTHER PUBLICATIONS

International Search Report mailed on Feb. 17, 2015 in International Application No. PCT/IB2014/065400 (6 pages).

Mott M et al."Microengineering of Ceramics by Direct Ink-Jet Printing",1999, J Am. Ceram.Soc., vol. 82 ,No. 7, pp. 1653-1658 (Jul. 31, 1999).

International Search Report mailed on Jan. 11, 2015 in International Application No. PCT/IB2014/065401 (6 pages).

International Search Report mailed on Oct. 17, 2014 in International Application No. PCT/IB2014/065402 (7 pages).

Oskol E. et al."Development of high solid content aqueous 3Y-TZP suspensions for direct inkjet printing using a thermal inkjet printer", 2009, Journal of the European Ceramic Society, vol. 29, pp. 403-409 (published on line: Aug. 13, 2008).

Capppi B. et al."Direct inkjet printing of Si3N4: Characterization of ink, green bodies and microstructure", 2008, Journal of the European Ceramic Society, vol. 28 pp. 2625-2628 (published on line: Apr. 28, 2008).

Song H. J. et al. "Formulation and Multilayer jet Printing of Ceramic inks", 1999, J. Am. 1-3, 13-17, 27, 28 Ceram. Soc., vol. 82, No. 12, pp. 3374-3380 (Dec. 31, 1999).

* cited by examiner

METHOD AND SYSTEM FOR APPLYING MATERIALS ON A SUBSTRATE

CROSS-REFERENCE TO RELATED APPLICATIONS

This application is a U.S. national application of PCT Patent application No. PCT/IL2009/001125, filed Nov. 30, 2009, claiming the benefit of U.S. provisional Application No. 61/118,653, filed Nov. 30, 2008, both of which are incorporated herein in their entirety.

BACKGROUND OF THE INVENTION

Introducing non-contact deposition technologies, such as inkjet printing or aerosol dispensing in the manufacturing of solar cells, flat panel displays, thin film transistors (TFT) or printed circuits may enable depositing conducting lines on a substrate. The required conductivity of conducting lines may need to be balanced with various other requirements or constraints. For example, while wider conducting lines may better conduct electric energy produced by solar cells, they may also block sun or other light required in the process. However, decreasing the width of the conducting lines may result in undesirable reduced electrical conductivity. Furthermore, a production, e.g., of solar cells, may require depositing a number of conducting lines in a respective number of orientations and/or a respective number of widths. In addition, conducting lines are typically required to be deposited in a specific location on a substrate and according to a specific distribution that may be a predefined distance between the conducting lines or another applicable relation.

Current systems and methods suitable for mass manufacturing of solar cells utilize conveyor processing to translate a substrate in a linear scan along a single axis typically referred to as the "scan axis" or "scan direction". Such conveyor processing is typically combined with a plurality of nozzles arranged in a print head essentially orthogonally to the scan axis or direction, often referred to as the "cross scan" axis. However, in prior art systems and methods, when a deposition of material is to be according to predefined patterns or parameters, nozzles may need to be specially arranged, installed or controlled. For example, printing a number of parallel lines on a substrate may require removing, disabling, interleaving or otherwise maintaining some of the nozzles. It is a technological challenge to enable system and method for a simple, quick and cost effective deposition of conducting lines on a substrate according to a predefined set of parameters such as width, orientation and distribution.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
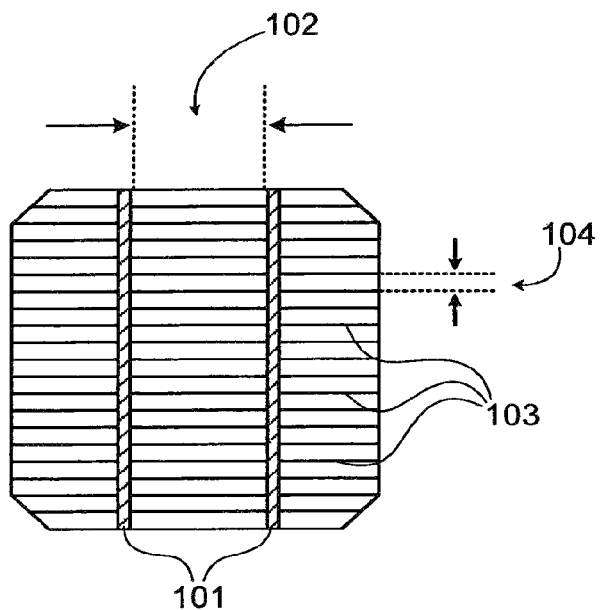
FIG. 1 shows exemplary metallization patterns according to embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Embodiments of the invention may be applicable to a variety of printing systems and methods. For the sake of clarity and simplicity exemplary embodiments and references of non-contact material deposition systems will mostly be for the application of fabrication of conducting metal lines for microelectronics, flat panel displays and solar cells using an inkjet system. However, the scope of the invention is not limited by such exemplary embodiments and may be applied to other deposition systems, such an aerosol jet deposition system or a dispenser and to other applications, such as graphics, press, mass media, packaging, electronics and others using any suitable inks or dispensing materials.

Embodiments of the invention are directed to method of printing lines, for example electrically conductive lines by non-contact deposition methods. For example, the method may include depositing material, such as silver on a substrate such as a semiconductor wafer from a plurality of inkjet nozzles to print electrically conductive contact lines. The line may be designed to have a desired dimension, e.g., width that would satisfy the conductivity requirements. Embodiments of the invention are also directed to depositing conducting lines according to predefined parameters such as orientation, width or location of one or more lines on a substrate and/or a parameter related to spacing values or other relation between lines. Such embodiments may be advantageous, for example, in depositing metallization patterns on a front side of photovoltaic cells.

As described herein, according to prior art, printheads or other print units are positioned along a direction or line that is perpendicular or orthogonal to a scan direction or axis. According to some embodiments, a plurality of printheads or other print units may be positioned along a scan axis or direction. The printheads thus positioned may further be installed, spaced or placed according to a desired and/or predefined spacing parameter or value. For example, three printheads may be installed along a scan direction and may further be separated or spaced such that three respective lines printed by such three printheads are spaced or are at a predefined distance from each other. Such arrangement may be combined with conveyor processing as described herein and known in the art. For example, a number of parallel lines may be printed or deposited at a number of locations on a substrate by a respective number of printheads arranged along a scan axis and by translating the substrate along the scan axis by a conveyor. As described herein, embodiments of the invention may enable printing of parallel lines at various spacing values, parameters or distances and according to other parameters. According to embodiments of the invention, possibly in addition to being arranged to produce parallel lines as described herein, printheads installed or positioned at an angle with respect to the scan axis or they may be tilted, rotated or otherwise positioned such that a width of a printed line is according to a predefined parameter. For example, in a single scan, a narrow second line may be printed in parallel to a wider first line at a distance of 2 centimeters (cm), and a third, yet wider line may be printed in parallel to the first and second lines in a distance of 1.5 cm from the second line. As described herein, printheads or other relevant printing units may be arranged to accommodate any applicable pattern.

Although embodiments of the invention may be applicable to a variety of print systems, methods and purposes, for the sake of clarity and simplicity, front side metallization of solar cells will mostly be referred to herein. However, it will be recognized that embodiments of the invention are not limited by or restricted to examples described herein and accordingly may be applicable to any applicable system, method or purpose.

Front side metallization of solar cells typically comprises equally spaced, thin conductive lines, often referred to as "fingers" or "finger lines". Finger lines are used to conduct the photo generated current to electrical terminals that enable a solar cell to provide electric power. The spacing between the lines may be a compromise between the demand to reduce losses due to the resistance of the material comprising the photovoltaic element, and the requirement to minimize shadow losses. A typical spacing between finger lines is 2 mm, where the line width may depend on the technology of manufacturing and may be under 100 µm. For photovoltaic elements comprising large areas, or when several solar cells are interconnected together to form a solar module, the fingers may have insufficient conductivity to efficiently conduct the photo generated current to the electrical terminals. The common approach to overcome this is to use several, e.g., two or three wider lines orthogonal to the finger lines called "busbars", or "tabs", to collect the photo generated current from the fingers, and to connect to other solar cells or to terminals. The bus bars are typically 1.5 to 3 millimeter (mm) in width.

Reference is now made to FIG. 1 showing exemplary metallization patterns according to embodiments of the invention. As shown by FIG. 1, a number of parallel, thin finger lines 103 may be deposited at a particular spacing, as shown by 104. Another set of parallel lines 101 that may be wider, e.g., the bus lines as described herein, may be printed according to a second spacing parameter as shown by 102. Accordingly and as shown by FIG. 1, embodiments of the invention may be configured to deposit a plurality of parallel lines according to at least a respective plurality of spacing parameters and a respective plurality of width parameters.

The pattern shown in FIG. 1 may be an example of a typical pattern that may be useful, e.g., in a mass production of solar cells. For the sake of clarity, this pattern will be further referred to herein, however, it will be recognized that this exemplary pattern is referred to herein as an example and that various other patterns, width, spacing or other parameters may be used in conjunction with embodiments of the invention. As described herein, patterns such as a finger lines 103 and bus lines or bars 101 may be applied by dispensing metallization material from one or more nozzles that may be installed in a print unit while the substrate is scanned beneath, in a scan direction. Therefore, an array of jetting nozzles oriented along a scan axis may be suitable for forming conducting lines of photovoltaic solar cells according to the pattern shown in FIG. 1.

According to embodiments of the invention and as described herein, a plurality of lines, e.g., metallization lines may be printed or deposited by a respective plurality of print units. According to embodiments of the invention, each metallization line may be deposited from or by a single array of nozzles oriented along the scan axis. Such array of nozzles may be fitted on or associated with a single print unit, e.g., a print head as known in the art. A printing unit may include any applicable number of nozzles, e.g., hundreds of nozzles. A pattern applied according to embodiments of the invention as described herein may require a reduced amount of metallization material, and can be applied, for example, by an inkjet printer having a significantly reduced number of inkjet elements. In some embodiments, a line may be printed by an array of deposition elements arranged in a linear array oriented essentially along the scan axis of a substrate.

Figure 2:
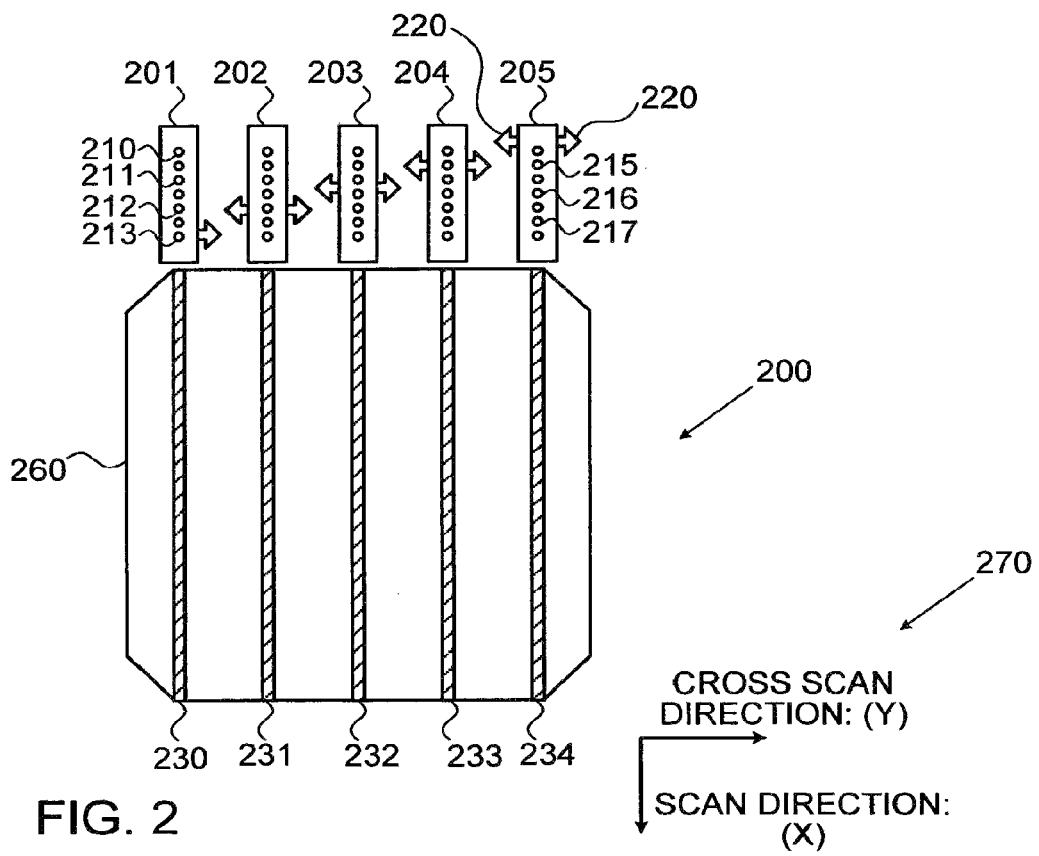
FIG. 2 shows an illustration of an exemplary arrangement of printing units and a related print pattern according to embodiments of the invention.

Reference is now made to FIG. 2 that shows illustrations of an exemplary arrangement of printing units and a related print pattern according to embodiments of the invention. As shown in FIG. 2 a printing system 200 may comprise print units 201, 202, 203, 204 and 205 each comprising dispensing nozzles, such as nozzles 210, 211, 212 and 213 fitted on print unit 201 and nozzles 215, 216 and 217 installed on print unit 205. As shown, the printing units may be arranged along the scan direction (as shown by coordinate system 270) such that nozzles which are part of a single printing unit may print a corresponding line on substrate 260.

As shown by arrows 220, print units may be shifted, translated or otherwise positioned or repositioned according to a predefined spacing parameter. For example, in order to produce 5 parallel lines at a specific distance from one another, print units 201-205 may be positioned according to such predefined spacing parameter and as shown by FIG. 2. For example, line 230 may be printed by printing unit 201; line 231 may be printed by printing unit 202 and so on. As further described herein, other printing arrangements are likewise applicable without departing from the scope of the invention. As shown by FIG. 2, in some embodiments, lines such as finger and/or bus lines may be deposited or printed at a fixed spacing and/or width. However, embodiments of the invention are not limited in this respect.

According to prior art, a print head is typically manufactured with a predetermined spacing of nozzles in order to enable printing of parallel lines, e.g., by positioning the print head along a cross scan axis. However, when different patterns are required, e.g., a different spacing between parallel lines, the print head may no longer be used and accordingly, may be replaced by another print head. As described herein, according to embodiments of the invention, rather than replacing print heads or units, they may simply be repositioned in order to accommodate a plurality of patterns.

Figure 3:
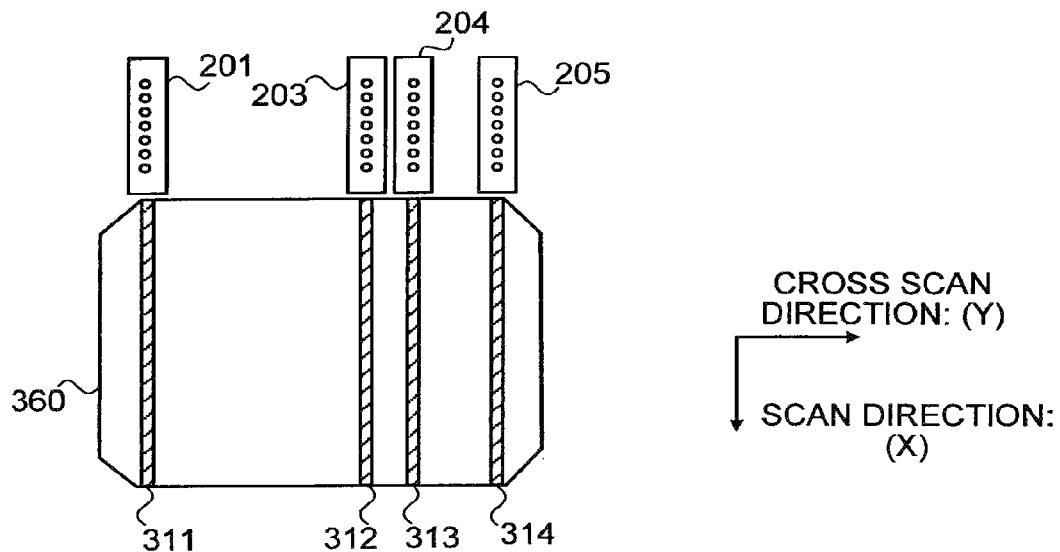
FIG. 3 shows an illustration of an exemplary arrangement of printing units and a related print pattern according to embodiments of the invention.

Reference is now made to FIG. 3 that shows illustrations of an exemplary arrangement of printing units and a related print pattern according to embodiments of the invention. As shown by FIG. 3, print units or print heads may be moved, shifted or otherwise positioned in order to enable any spacing between printed lines. In some cases, some print heads or units may be disabled, e.g., in order to achieve large spacing or distances between printed lines. As shown in FIG. 3, print units 201, 202, 203, 204 and 205 may be rearranged in order to achieve a pattern different from the pattern shown in FIG. 2. For example, print unit 202 may be removed, print unit 203 may be moved left towards print unit 204 and print unit 204 may be moved right towards print unit 203. Accordingly, spacing or distances between resulting lines 311, 312, 313 and 314 formed on substrate 360 may be different from that of lines 230-234 shown in FIG. 2.

As described herein, a distance between printed lines may be determined and/or achieved by properly positioning print units or print heads, for example, as shown by FIG. 2 and/or FIG. 3. In some embodiments, a desired width of a printed line may be achieved by tilting, diagonally positioning, rotating or positioning a print unit at an angle with respect to a scan direction.

Figure 4:
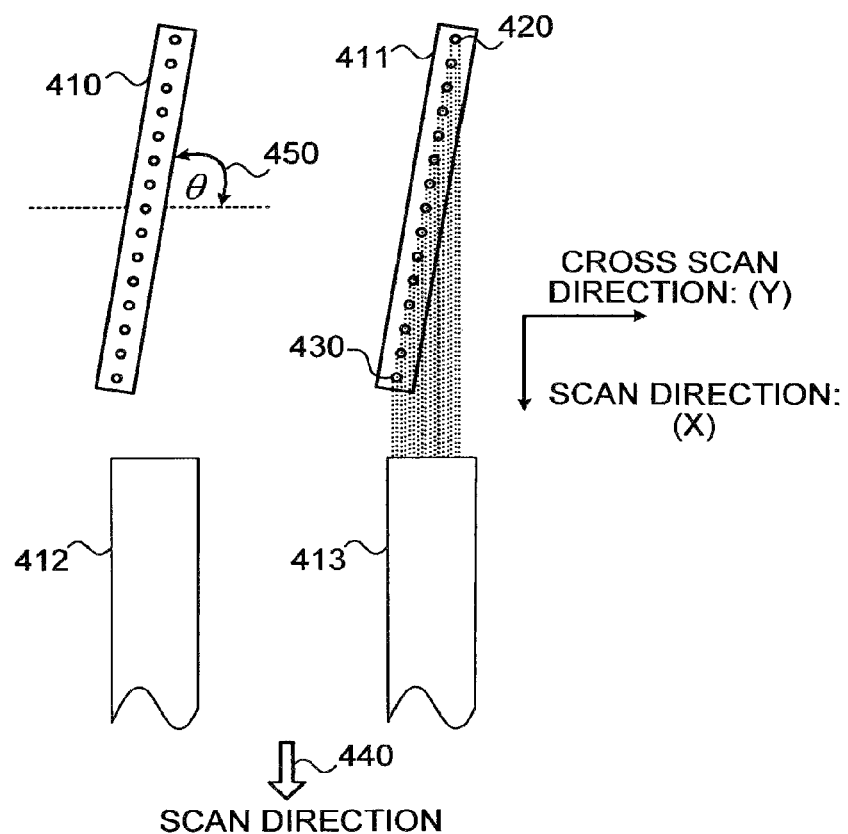
FIG. 4 shows an illustration of an exemplary arrangement of printing units and a related print pattern according to embodiments of the invention.

Reference is now made to FIG. 4 that shows illustrations of an exemplary arrangement of printing units and a related print pattern according to embodiments of the invention. As shown in FIG. 4, print units 410 and 411 may be rotated, tilted, turned or otherwise positioned at an angle with respect to a scan direction as shown by scan direction arrow 440, e.g., as shown by angle θ 450. Accordingly and as shown, a corresponding width of printed lines 412 and 413 may result. According to embodiments of the invention, positioning print units at an angle as shown in FIG. 4 may be according to a number of considerations, constraints and/or parameter. For example, a tilt or angle of a print head may be according to a desired width of the printed line. Another consideration may be a level of overlapping of deposited material. For example, when the θ angle between print head 411 and the scan direction is ninety degrees (90°), a full overlap may result, namely, nozzles 420 and 430 shown on print head 411 may fully overlap, accordingly, nozzle 430 may deposit material substantially on the same location material was deposited by nozzle 420. However and as shown, decreasing the angle θ to any value under ninety degrees (90°) may result an overlap of deposition of material, namely, only some of the material deposited by a first nozzle may be deposited on top of material deposited by another nozzle fitted on the same print head or unit. Accordingly, embodiments of the invention may control a level of overlapping by adjusting, configuring or otherwise controlling an orientation of a print unit.

For example, while finger lines described herein are typically narrow lines, bus bars are typically wider. Accordingly, a number of print units may be positioned at an angle as described herein in order to deposit a respective number of bus lines or a number of print units may be positioned at an angle as described herein in order to deposit a single bus or other, possibly wide line. A specific width of a line may be achieved by a specific tilt of a print unit. For example, id the distance between nozzles 420 and 430 is D then in order to cause print unit 411 to deposit a line of width W a tilt angle θ may be chosen such that $W=D(\cos(\theta))$. Any applicable parameter may be taken into account when calculating an angle (e.g., θ) of a print head relative to a scan direction. For example, a length of the print unit, the number of nozzles fitted on the print unit, the spacing or distance between nozzles on a print unit, a level of overlapping of deposition and a desired width of a printed line may be considered when tilting a print unit as shown in FIG. 4 and described herein. The number of nozzles, their respective spacing a desired width of a line and a desired level of overlapping may all be addressed by appropriate calculations. As an example, for dot size of 50 μm in diameter and a 50% overlapping 40 inkjet elements may be required in order to cover a cross scan segment of 1 mm. Such calculations may be performed in order to determine an angle of rotation or tilt (e.g., θ in FIG. 4), possibly taking into account various related parameters such as described herein.

Positioning print units or print heads along a scan axis or parallel to a scan axis or direction as described herein may be advantageous in a number of ways. For example, an orientation of nozzles in arrays parallel to the finger lines has the advantage that deposition of material may be from multiple nozzles belonging to the same array or print unit. Therefore, a well known problem in the art known as mis-registration resulting from mechanical misalignment when deposition is performed from nozzles belonging to different print heads may be circumvented or avoided. Correspondingly, the method offers an advantage of significantly simplified calibration procedure of the printer avoiding precise alignment between different print-heads. For example, securing print-heads to a position as shown by FIGS. 2, 3 and 4 may guarantee a precision printing of lines as respectively shown in FIGS. 2, 3 and 4.

Embodiments of the invention, for example those described with reference to FIGS. 2, 3 and 4 may be utilized in various ways. For example, a material deposition system may enable high precision printing or deposition of patterns.

As known in the art, precision or resolution of conveyor based systems is asymmetric with respect to the scan direction. In the scan direction, the resolution is primarily determined by the scan velocity and resolution or precision, and by the ejection frequency. The resolution in the cross scan direction is primarily determined by the number of the nozzles per unit length projected on the cross scan direction. Accordingly, the resolution, accuracy or precision in the scan direction are inherently higher than those in the cross scan direction. Embodiments of the invention enable relaxing or reducing constraints such as precision or resolution with respect to the cross scan direction by depositing lines of any orientation or direction in the scan direction. According to embodiments of the invention, a substrate may be rotated or otherwise positioned such that any line, along any direction or at any orientation is printed while scanning the substrate at the scan direction. Accordingly, in a system according to embodiments of the invention, high resolution may only be required in one axis and can be relaxed in other, e.g., orthogonal axes. By rotating a substrate, high resolution or precision printing may still be achieved for any pattern including lines along any direction or at any orientation.

According to embodiments of the invention, a method of applying metallization lines by direct-write material deposition printer comprising the steps of forming a first set of metallization lines (e.g., finger lines) by scanning a substrate in an axis parallel to the first set of lines, depositing each line from a single column of nozzles oriented along the scan axis, rotating the substrate, e.g., by 90 degrees, and subsequently forming a second set of metallization lines (e.g., bus lines or bus bars) by scanning the substrate in an axis parallel to the second set of lines. It will be recognized that any number of such sets of lines may be printed or deposited by such method and/or as described herein without departing from the scope of the invention.

Figure 10:
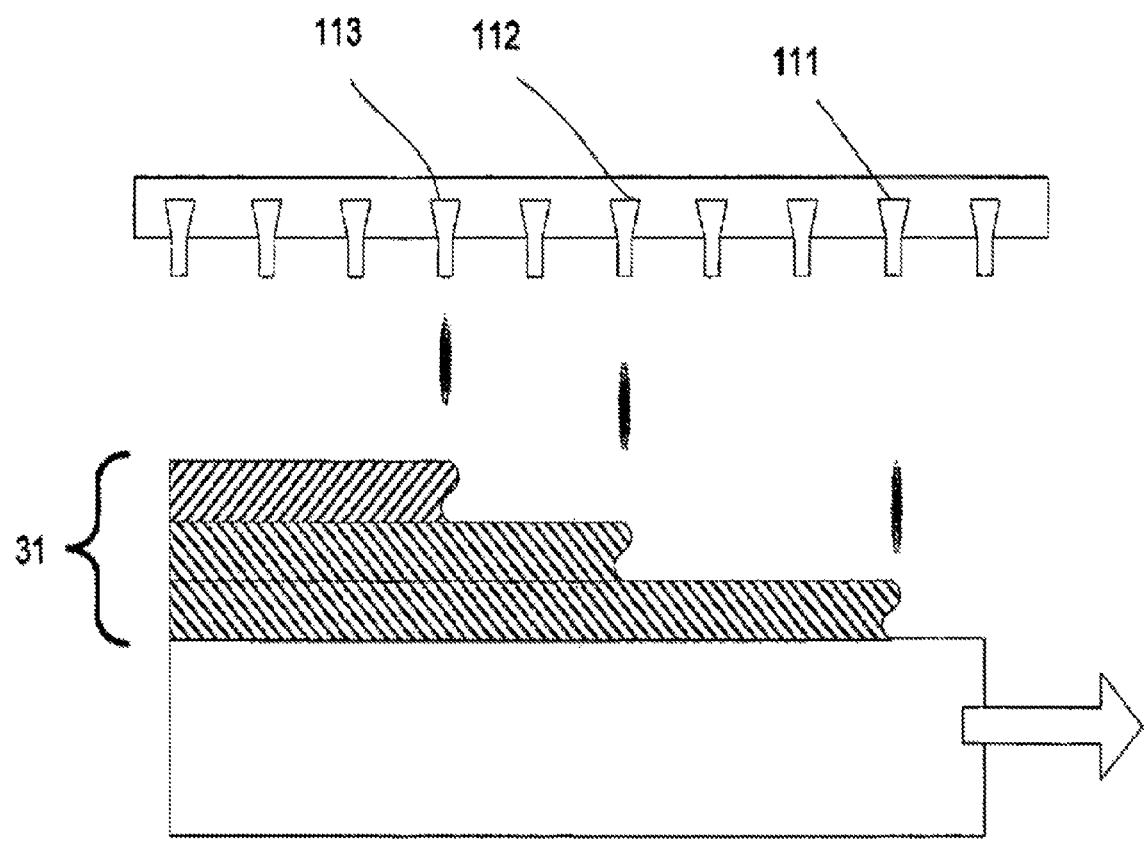
FIG. 10 shows an illustration of a finger line formed by a single array of nozzles.

The required thickness of metallization lines (e.g., finger lines) for adequate conductivity is achieved by applying metallization of consecutives nozzles belonging to the same arrays, preferably in a single substrate scan. FIG. 10 provides an illustration of finger line 31 formed by depositing from a single array of nozzles in a single scan; first layer is applied from nozzle 111, followed by deposition from nozzle 112 forming the second layer; the third layer is deposited from nozzle 113, and so forth, the number of layers depends on the desired line height. Typically adjacent nozzles cannot be used for multi layered deposition of drops. After the drop lands on the substrate it takes a certain time to dry before subsequent drop can be deposited on top of the preceding one. This time interval depends on various details related to the chemical composition of the ink, the substrate, and ambient conditions. Depending on the scan velocity of the substrate this dictates a certain minimum distance between firing nozzles.

Figure 5:
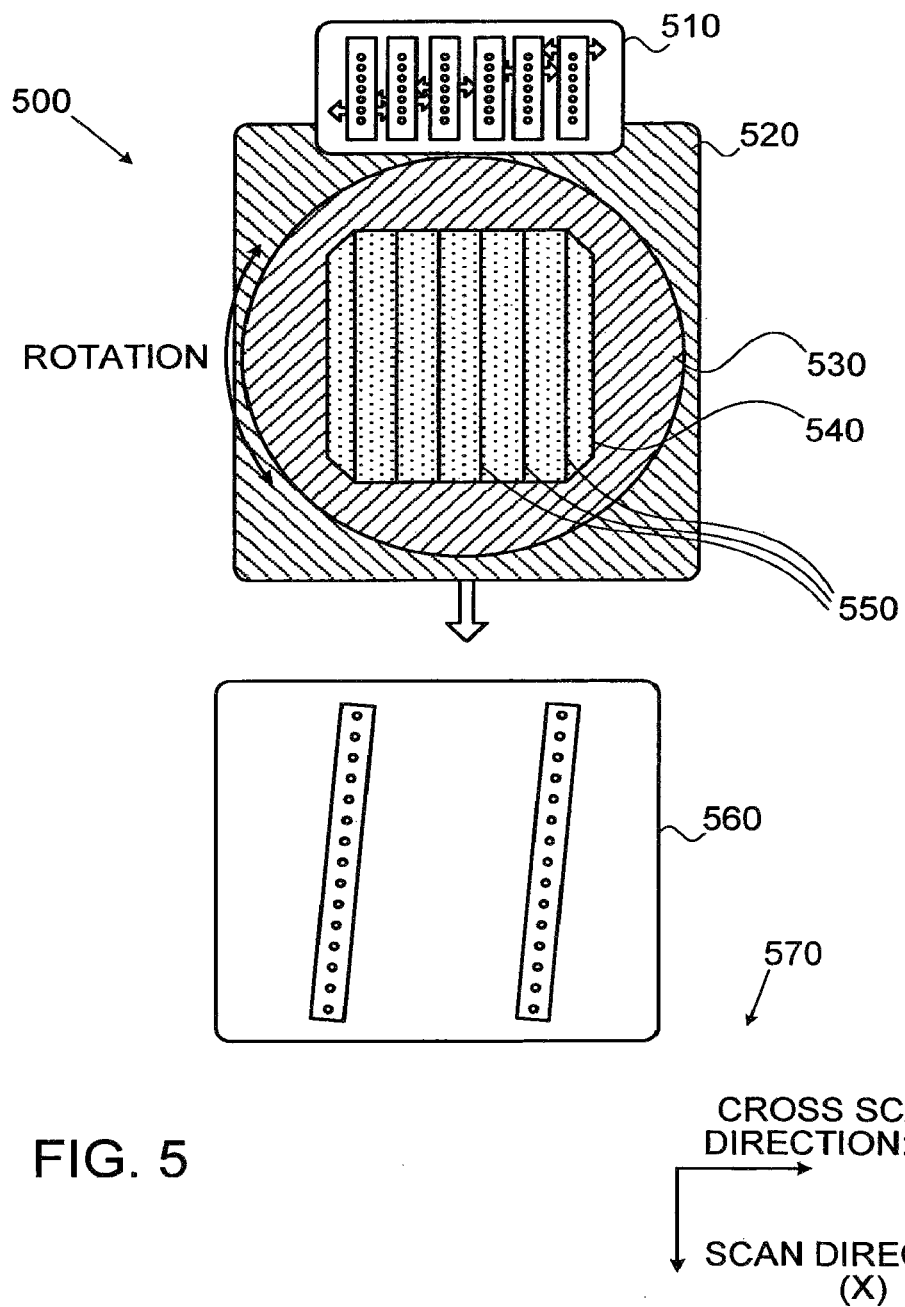
FIG. 5 shows an illustration of an exemplary arrangement of printing units and a positioning unit according to embodiments of the invention.

Reference is now made to FIG. 5 that shows an illustration of an exemplary arrangement of printing units and a positioning unit according to embodiments of the invention. As shown by FIG. 5, a system 500 may include a first plurality of print units 510 that may be arranged as described herein with respect to FIG. 2. System 500 may include a second plurality of print units 560 that may be arranged as described herein with respect to FIG. 4. System 500 may include a positioning unit or assembly comprising a translation table 520 and a rotation unit 530. Rotation unit 530 may be provided with a sensor, such as for example an optical encoder, which may tracks its motion with a high degree of precision and provides feedback to a closed loop operation by the control unit. Rotation unit 530 may be capable of rotation at any applicable angle with high precision and resolution. For example, resolutions of better than 2 micro radians (0.4 arc-seconds) with repeatability of better than 20 micro radians (4 arc-seconds).

As shown, lines 550 may be printed on substrate 540 that may be a silicon wafer or a solar cell. According to embodiments of the invention, translation table 520 may translate substrate 540 along the scan axis (or X-axis) as shown by coordinate system 570. Accordingly, each of lines 550 may be printed by one respective print unit from print units 510. Deposition of lines 550 that may be finger lines as described herein may include positioning print units 510 along or according to the scan direction as shown by coordinate system 570. Print units 510 may further be spaced according to a desired spacing of the finger lines 550, e.g., print units 510 may be placed 2 mm apart from one another. A particular or specific finger line may be printed by a single print unit. Accordingly, printing a plurality of lines may be achieved by a respective plurality of print units or heads. In some embodiments of the invention, after material is deposited by print units 510, rotation unit 530 may rotate substrate 540, for example, by ninety (90) degrees.

Figure 6:
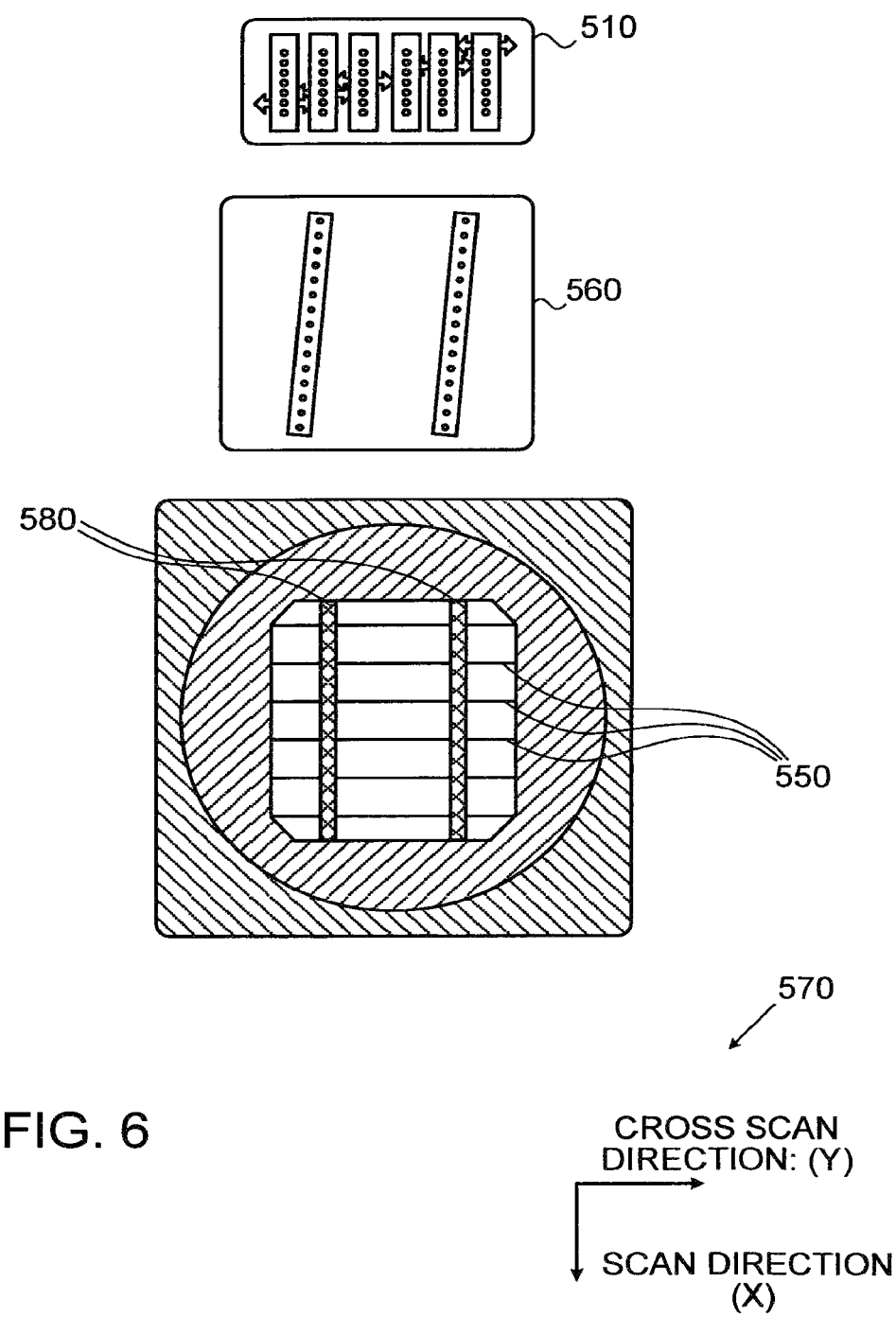
FIG. 6 shows an illustration of an exemplary arrangement of printing units and a positioning unit according to embodiments of the invention.

Reference is now made to FIG. 6 that shows an illustration of an exemplary arrangement of printing units and a positioning unit according to embodiments of the invention. As described herein, following a printing of finger lines 550, substrate 540 may be rotated, for example, by ninety degrees (90°). According to embodiments of the invention, following such rotation, substrate 540 may be translated by print units 560. As shown by FIG. 6, a set of lines 580, orthogonal to lines 550 may be printed by print units 560. As shown, the result may be a pattern including finger lines and bus lines all printed at the scan direction. As shown, lines 580 may be wider than lines 550. Accordingly, printing each of lines 580 may require more than a single nozzle. As shown, print units may be installed, fitted, mounted, arranged or positioned in an angle with respect to the scan direction shown. Accordingly, a number of nozzles may be used in order to print any one of lines 580 as described herein, e.g., with reference to FIG. 4.

Although exemplary embodiments described herein include translating a substrate in a scan direction and/or rotating a substrate, other possibilities and/or implementations exist. For example, in some embodiments, rather than or in addition to translating and or rotating the substrate, print units may be translated and/or rotated. For example, a first set of print units may be translated to scan a substrate in a first direction and deposit a first set of line, e.g., the finger lines and a second set of print units, possibly differently positioned, may be translated to scan a substrate in a second direction and deposit a second set of line, e.g., the bus lines.

Although exemplary systems and methods described herein include an element of rotating a substrate, other possibilities are enabled by embodiments of the invention. According to embodiments of the invention, a printing system may include a translation system that enables scanning a substrate in two orthogonal or different axes.

Figure 7:
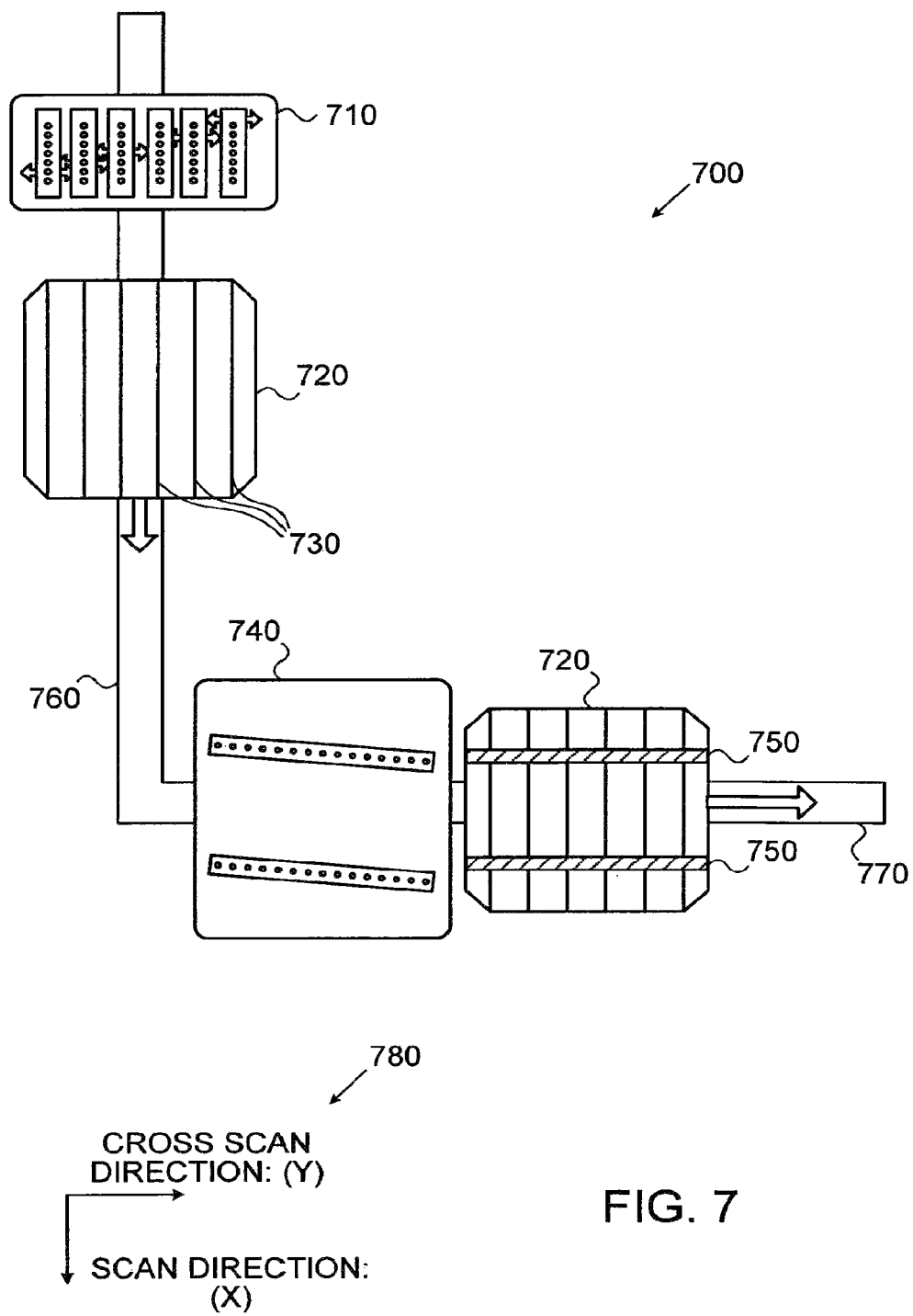
FIG. 7 shows an illustration of an exemplary arrangement of printing units and a translation unit according to embodiments of the invention.

Reference is now made to FIG. 7 that shows an illustration of an exemplary arrangement of printing units and a translation unit according to embodiments of the invention. As shown in FIG. 7, a system 700 may include print units arrays 710 and 740 and a translation unit or system that may comprise translation stages or units 760 and 770. As shown, substrate 740 may be translated from a first location to a second location by translation stages 760 and 770. Translation or stage units 760 and 770 may be combined or otherwise operatively connected such that a substrate 720 may be translated at first and second directions. For example and as shown, translation unit 760 may translate substrate 720 in the Y direction shown by coordinate system 780 and translation unit 770 may translate substrate 720 in the X direction shown by coordinate system 780. As described herein, e.g., with reference to FIG. 5, a first set of lines 730, e.g., finger lines, may be printed or deposited by print units array 710 while substrate 720 is translated under or in proximity to array 710. Substrate 720 may be carried by translation unit 760 to a location where it may be picked up by, or otherwise transferred to translation unit 770. Translation unit 770 may translate substrate 720 under or in proximity to array 740 where a second set of lines 750 (e.g., bus lines), that may be orthogonal to the first set 720 may be deposited. It will be recognized that any number of translation units such as units 760 and 770 may be combined in order to translate a substrate at any suitable, applicable or required direction and accordingly, lines at any direction may be printed in a scan direction.

Although examples described herein mainly refer to orthogonal scan directions or rotations, other possibilities are enabled by embodiments of the invention. For example, a rotation of twenty degrees (20°) or a hundred and twenty degrees (120°) is possible. A metallization pattern can be optimized according to various parameters in addition to shadow losses, such as for example, resistance losses of the semiconductor, charge carrier mean free path, total length of metallization lines, to name a few. Generally therefore the pattern of preference may have any geometry comprising of metallization lines other than orthogonal lines as described above.

Figure 8:
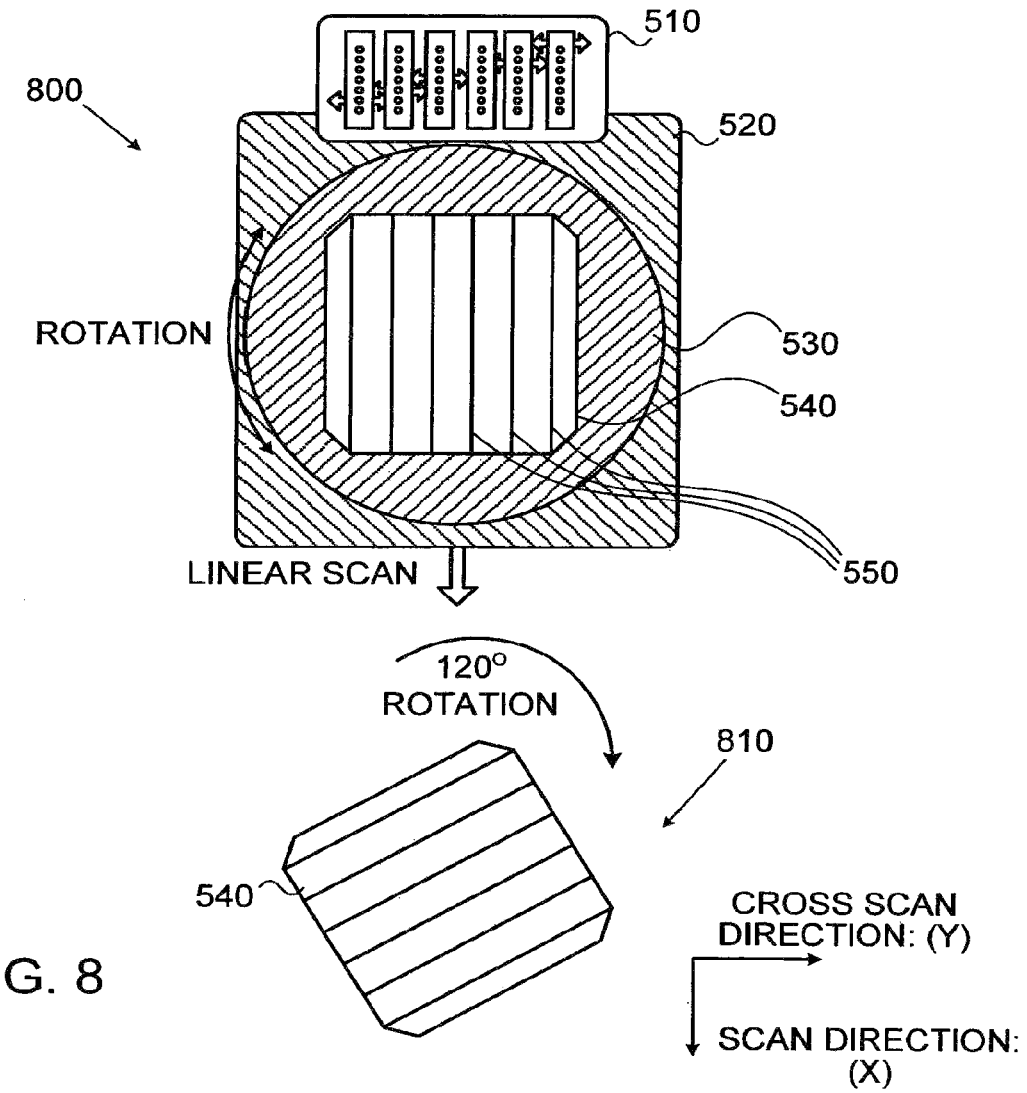
FIG. 8 shows an illustration of an exemplary arrangement of printing units, a translation unit and an exemplary rotation of a substrate according to embodiments of the invention.
Figure 9:
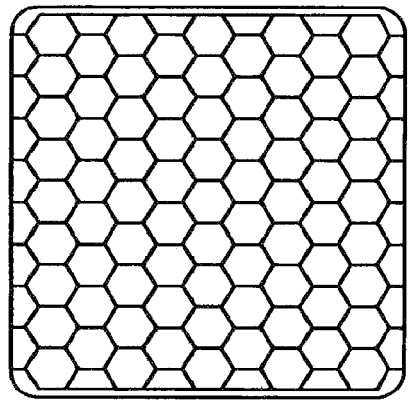
FIG. 9 shows an exemplary pattern according to embodiments of the invention.

Reference is now made to FIG. 8 that shows an illustration of an exemplary arrangement of printing units, a translation unit and an exemplary rotation of a substrate according to embodiments of the invention. As shown in FIG. 8, a system 800 may include a plurality of print units 510, translation table 520 and a rotation unit 530 as described herein with reference to FIG. 5. Lines 550 may be deposited on substrate 540 as described herein with reference to FIG. 5. As shown by 810, substrate 540 may be rotated at angle other than 90°. For example and as shown, substrate 540 may be rotated at angle of 120°. Reference is additionally made to FIG. 9 showing a pattern that may be achieved by rotating a substrate by 120° after a first scan and again by 120° after a second scan. According to embodiments of the invention, after a substrate has been rotated as shown it may be translated to a second set of print units where a second set of lines may be deposited. Alternatively or additionally, a substrate may be translated back and forth, e.g., in a first direction and then in the reverse direction. For example, after substrate 540 has been rotated as shown by 810, substrate 540 may be translated back towards print units 510 where a second set of lines may be printed. Accordingly, a substrate may be scanned multiple times under the same array of print units, print heads or nozzles and may further be positioned oriented at a different angle relative to the scan axis during each of such multiple scans.

Embodiments of the invention may include an article such as a computer or processor readable medium, or a computer or processor storage medium, such as for example a memory, a disk drive, or a USB flash memory, encoding, including or storing instructions, e.g., computer-executable instructions, which when executed by a processor or controller, carry out methods disclosed herein.

Unless explicitly stated, the method embodiments described herein are not constrained to a particular order or sequence. Additionally, some of the described method embodiments or elements thereof can occur or be performed at the same point in time or overlapping points in time. As known in the art, an execution of an executable code segment such as a function, task, sub-task or program may be referred to as execution of the function, program or other component.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units; parameters, or the like.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

The invention claimed is:

1. A metal deposition method, comprising:
   initially jetting metal material to form a first layer of metal material through an array of nozzles arranged in a plurality of lines with each succeeding nozzle in each line being arranged behind a prior nozzle in the same line, with reference to a scan direction on a substrate;
   controlling metal deposition such that the array of nozzles is enabled to deposit metal material to form a second and third layer of metal material in overlap with the first layer of metal material; and
   subsequently jetting metal material toward the substrate multiple times using the same array of nozzles in order to form a number of additional layers of metal material on top of previously deposited metal material atop the substrate, wherein the number of additional layers depends on a desired height.

2. The method of claim 1, wherein each of the plurality of lines is configured to form a line of deposited metal material.

3. The method of claim 1, the array of nozzles includes hundreds of nozzles.

4. The method of claim 1, wherein the array of nozzles is arranged orthogonally to the scan direction.

5. The method of claim 1, wherein controlling metal deposition includes causing the nozzles to form a metal pattern.

6. The method of claim 1, wherein the nozzles are configured to jet metal material.

7. The method of claim 1, wherein the overlap is the result of a succeeding nozzle depositing metal material substantially on the same location that metal material was deposited by a preceding nozzle.

8. The method of claim 1, wherein controlling metal deposition includes a level of metal material overlap to create a full overlap with the metal material deposited by the preceding nozzle in line.

9. The method of claim 1, wherein controlling metal deposition includes causing a plurality of parallel lines to be printed simultaneously.

10. The method of claim 1, wherein controlling metal deposition includes altering the scan direction between successive scans.

11. A metal deposition apparatus, comprising:
    an array of nozzles arranged in a plurality of lines with each succeeding nozzle in each line being arranged behind a prior nozzle in the same line, with reference to a scan direction on a substrate;
    a controller for controlling metal deposition such that the array of nozzles is enabled to deposit metal material to form a second and third layer of metal material in overlap with a first layer of metal material previously deposited; and
    wherein the controller is configured to enable the substrate to be scanned multiple times under the same array of nozzles in order to form a number of additional layers of metal material on top of previously deposited metal material, wherein the number of additional layers depends on a desired height.

12. The apparatus of claim 11, wherein each of the plurality of lines is configured to form a line of deposited metal material.

13. The apparatus of claim 11, the array of nozzles includes hundreds of nozzles.

14. The apparatus of claim 11, wherein the array of nozzles is arranged orthogonally to the scan direction.

15. The apparatus of claim 11, wherein the controller is configured to cause the nozzles to form a metal pattern.

16. The apparatus of claim 11, wherein the nozzles are configured to jet metal material.

17. The apparatus of claim 11, wherein the overlap is the result of a succeeding nozzle depositing metal material substantially on the same location that metal material was deposited by a preceding nozzle.

18. The apparatus of claim 11, wherein the controller is enabled to control a level of metal material overlap to create a full overlap with the metal material deposited by the preceding nozzle in line.

19. The apparatus of claim 11, wherein the controller is configured to cause a plurality of parallel lines to be printed simultaneously.

20. The apparatus of claim 11, wherein the controller is configured to alter the scan direction between successive scans.

* * * * *